(12) United States Patent
De Vries

(10) Patent No.: US 6,853,570 B2
(45) Date of Patent: Feb. 8, 2005

(54) CIRCUIT FOR QUASI-SQUARE-WAVE OR RESONANT DRIVING OF A CAPACITIVE LOAD

(76) Inventor: Ian Douglas De Vries, 11 Park Rd., Gardens, Cape Town 8001 (ZA)

( * ) Notice: Subject to any disclaimer, the term of this patent is extended or adjusted under 35 U.S.C. 154(b) by 415 days.

(21) Appl. No.: 10/037,108

(22) Filed: Oct. 22, 2001

(65) Prior Publication Data

US 2002/0141213 A1 Oct. 3, 2002

(51) Int. Cl.$^7$ ............................................. H02M 7/537
(52) U.S. Cl. ........................................ 363/131; 363/135
(58) Field of Search ................................ 363/131, 134, 363/135, 139

(56) References Cited

U.S. PATENT DOCUMENTS

| | | | |
|---|---|---|---|
| 3,377,541 A | 4/1968 | Farkas | 321/15 |
| 3,626,244 A | 12/1971 | Holz | 315/169 R |
| 3,760,285 A | 9/1973 | Milberer et al. | 328/232 |
| 3,984,705 A | 10/1976 | George | 310/8.1 |
| 4,070,663 A | 1/1978 | Kanatani et al. | 340/324 M |
| 4,107,757 A | 8/1978 | Masuda et al. | 361/235 |
| 4,743,789 A | 5/1988 | Puskas | 310/316 |
| 4,866,349 A * | 9/1989 | Weber et al. | 315/169.4 |
| 5,126,589 A * | 6/1992 | Renger | 310/270 |
| 5,668,703 A * | 9/1997 | Rossi et al. | 363/16 |
| 5,852,358 A | 12/1998 | Ehsani | 323/240 |

FOREIGN PATENT DOCUMENTS

| | | | | |
|---|---|---|---|---|
| EP | 0261584 | 3/1988 | | G09G/3/28 |
| EP | 0472971 | 3/1992 | | B06B/1/06 |
| EP | 0655826 | 5/1995 | | H02M/3/158 |
| GB | 1327406 A | 8/1973 | | H03K/17/02 |
| JP | 6382121 | 4/1988 | | H03K/17/16 |

\* cited by examiner

Primary Examiner—Jeffrey Sterrett
(74) Attorney, Agent, or Firm—Ladas & Parry

(57) ABSTRACT

The invention discloses a method, together with circuits for performing these actions, of driving a capacitance with a quasi-square wave of variable duty cycle and frequency in such a manner that the energy stored in the capacitor is not lost. The energy is actually recycled to be stored back in the capacitor again but with an effective opposite polarity voltage. The circuits to achieve this operation comprise of the capacitor to be driven, coupled to an inductor which is driven by either two switches and two diodes, or by two bilateral switches and timing circuitry.

6 Claims, 4 Drawing Sheets

CIRCUIT FOR QUASI-SQUARE-WAVE OR RESONANT DRIVING OF A CAPACITIVE LOAD

FIELD OF INVENTION

This invention relates generally to charging and discharging a capacitance in a low-loss manner. More particularly, it relates to charging and discharging a capacitive type load in low-loss manner and doing so in such a way that a square type wave or quasi-square-wave is imposed on the capacitance. The quasi-square-wave can have a variable frequency and duty cycle.

BACKGROUND

There are many applications in electronics that require a capacitive type load to be driven with a square wave voltage. This capacitance may be for example, the input gate capacitance of a power MOSFET, the input gate capacitance of CMOS logic gates, the input or clock lines of VLSI digital circuits, memory address lines and the row/column select lines of a LCD matrix. The conventional manner of driving a capacitance with a square wave of variable frequency and duty cycle is illustrated in FIG. 1 (prior art). The conventional capacitance-driver (1) consists of two switches (S1 and S2) connected in series in a half-bridge configuration. The junction between the two switches (i.e. the midpoint) drives the capacitance directly. The switches are usually implemented using semiconductor devices such as FETs or bipolar transistors. The capacitance is charged through switch S1 to the supply voltage $V_s$, and discharged through S2 to ground. The conventional driver can operate with a variable duty cycle from DC—to its maximum working frequency, and it can keep the voltage across the capacitance in one state (high or low) indefinitely. However, the conventional driver (1) of FIG. 1 suffers from some significant disadvantages, the main one being the inherent power loss or power dissipation associated with this method.

The capacitive power dissipation of the conventional driver (1) can be calculated as follows. If the capacitance, C, is being driven by a square wave of frequency, $f_s$ (referred to as the switching frequency), and a peak to peak swing equal to $V_s$, then the power dissipated in the conventional driver (1) is given by the equation $$P_D = C V_s^2 f_s \quad (1)$$

If the capacitance is non-linear then the power dissipated is given by $$P_D = Q_g V_s f_s \quad (2)$$

where $Q_g$ is the total amount of charge need to charge the capacitance from ground to $V_s$. It can be seen that the power dissipated is independent of the on-resistance of the switches used to charge and discharge the capacitance i.e. lowering the on-resistance will have no effect on the amount of power dissipated. The power dissipated is proportional to the switching frequency and can become a very significant factor with increasing switching frequencies, and/or large capacitances, and/or large voltages. An example of this capacitive power dissipation is the fact that it is main cause of power loss in most current computer processors.

The conventional driver (1) also suffers from other disadvantages when used in applications such as MOSFET gate drivers or capacitive line drivers. These include;

1. The original square wave drive signal is usually generated by logic circuits, and hence will be a logic level signal (e.g. 5V or 3.3V). However, many applications (but not all) require the voltage across the capacitor to be higher than this. For example, a power MOSFET requires the gate capacitance to be charged up 10V or more. Hence the conventional driver must be provided with an independent higher supply voltage of 10V or more (shown as $V_s$ in FIG. 1.). In addition to the higher supply voltage, a means of level shifting the original logic level drive signal must then also be provided to enable the high side switch S1 to be driven.
2. During the switching transitions (as S1 turns off and S2 turns on or vice-versa), some cross-conduction through S1 and S2 arises due to the fact that practical switching devices will have non-zero switching times. This is another cause of power loss in the conventional driver (1) and this loss again increases with increasing switching frequency.
3. Parasitic (leakage) inductance in the charging or discharging path can cause undesired effects such as ringing.

The following patents and publications have all attempted to address the above problems to some degree with various solutions.

| Patents | | |
| --- | --- | --- |
| US3377541 | 1968 | Farkus |
| US4873460 | October 1989 | Rippel |
| US4967109 | October 1990 | Steigerwald |
| US5010261 | April 1991 | Steigerwald |
| US5804943 | September 1998 | Kollman et al. |
| GB1327406 | October 1970 | Milberger |
| US3636476 | 1972 | Milberger |
| US3760285 | 1973 | Milberger et al. |
| US5473526 | December 1995 | Svensson et al. |
| US5514921 | May 1996 | Steigerwald |
| US5537021 | July 1996 | Weinberg et al. |
| US5559478 | September 1996 | Athas et al. |
| US4107757 | 1978 | Masuda |
| US5134320 | June 1992 | Perusse |
| US5264736 | November 1993 | Jacobson |
| US5276357 | January 1994 | Cripe |
| US5852358 | 1998 | Eshani |

Other Publications

W. Tabisz, P. Gradezki, F. C. Lee. "Zero-Voltage-Switch Quasi-Resonant buck and flyback Converters—Experimental results at 10 MHz." IEEE Power Electronics Speacialists Conference Record, 1987, pp. 404–413.

Dragan Maksimovic, "A MOS Gate Drive With Resonant Transitions." 22nd Annual IEEE Power Electronics Specialists Conference (PESC), Jun. 23–27, 1991, pp. 527–532.

H. L. N. Wiegman, "A Resonant Pulse Gate Drive for High Frequency Applications," General Electric Corporate Research & Development, IEEE 0–7803–0485, Mar. 3, 1992, pp. 738–743.

These circuits are not without their disadvantages and suffer from some or all of the following limitations. The circuits are usually limited to driving the capacitance between two set voltage levels which depend on the supply voltage provided and may still require a higher supply voltage. Some of the circuits require bi-directional switches, and hence will have the practical difficulties and limitations associated with bi-directional switches. Some of the circuits require complex timing circuitry that has to be designed for a particular value of capacitance and inductance and hence they will be limited in their use to a particular application.

SUMMARY OF INVENTION

According to a first aspect of the present invention there is provided a circuit for driving a capacitive load so that a quasi-square-wave voltage is imposed on it, the circuit comprising: voltage supply means for providing a potential difference; an inductance, said capacitive load being connected between a first end of said inductance and the lower potential of said voltage supply; a first switch means and a first diode means connected in series between the higher potential of the said voltage supply and a second end of the said inductance, the said first diode means having its polarity orientated so that it allows current flow from the higher potential of said voltage supply to the second end of the said inductance; a second switch means and a second diode means connected in series between the second end of the said inductance and the lower potential of said voltage supply, the said second diode means having its polarity orientated so that it allows current flow from the second end of the said inductance to the lower potential of said voltage supply; means for applying a square wave drive signal to said first and second switch means, said first switch means being closed on the first level of said drive signal and open on the second level of said drive signal and the said second switch means being open on the first level of said drive signal and closed on the second level of said drive signal. Further improvement may be made wherein part of said inductance is introduced in series with said first switch means and said first diode means to form a separate charging inductance, and part of said inductance is introduced in series with said second switch means and said second diode means to form a separate discharging inductance.

According to a second aspect of the present invention there is provided a circuit for driving a capacitive load so that a quasi-square-wave voltage is imposed on it, the circuit comprising: voltage supply means for providing a potential difference; an inductance, said capacitive load being connected between a first end of said inductance and the lower potential of said voltage supply; a first bilateral switch means connected between the higher potential of the said voltage supply and the second end of the said inductance; a second bilateral switch means connected between the second end of the said inductance and the lower potential of said voltage supply; a first and second timing circuitry means to which a square wave drive signal is applied; means for applying the signal from said first timing circuitry means to said first bilateral switch means and means for applying the signal from said second timing circuitry means to said second bilateral switch means; said first timing circuitry means closing said first bilateral switch means on one edge of said drive signal and opening it after a time equal to $\pi\sqrt{(LC)}$ and said second timing circuitry means closing said second bilateral switch means on the other edge of said drive signal and opening it after a time equal to $\pi\sqrt{(LC)}$, where L is said inductance and C is said capacitive load.

According to a third aspect of the present invention there is provided a circuit for driving a capacitive load so that a quasi-square-wave voltage is imposed on it, the circuit comprising: voltage supply means for providing a potential difference; an inductance, said capacitive load being connected between a first end of said inductance and the lower potential of said voltage supply; a first controlled rectifier means connected between the higher potential of the said voltage supply and a second end of the said inductance; a second controlled rectifier means connected between the second end of the said inductance and the lower potential of said voltage supply; a first and second pulse circuitry means to which a square wave drive signal is applied; means for applying the signal from said first pulse circuitry means to said first controlled rectifier means and means for applying the signal from said second pulse circuitry means to said second controlled rectifier means; said first pulse circuitry means providing a trigger pulse to turn on said first controlled rectifier means on one edge of said drive signal and said second pulse circuitry means providing a trigger pulse to turn on said second controlled rectifier means on the other edge of said drive signal.

BRIEF DESCRIPTION OF DRAWINGS

For a better understanding of the present invention, and to show how the same may be carried into effect, reference will now be made, by way of example, to the accompanying drawings in which.

DETAILED DESCRIPTION OF INVENTION

The object of the present invention is to find a comprehensive yet simple solution to all of above problems of the conventional capacitance driver (1) described above, but still maintain some of its functionality. A relatively simple circuit is disclosed that is capable of driving a capacitive type load with a quasi-square-wave of varying duty cycle and frequency, but can do so with low power losses. The circuit is also capable of driving the capacitance with a higher voltage than its own supply voltage. In order to charge and discharge a capacitor in a loss-less manner, energy must be transferred to the capacitor from a specified source when charging and then returned when discharging. The energy transfers must be done in a loss-less manner. The principle employed by the present invention is that the energy is always stored in the capacitor, but the capacitor voltage is effectively alternated between a positive and negative voltage state.

The mechanism used to transfer the energy between the two voltage states in a loss-less manner can be described as follows. It is assumed that the process starts with the energy stored in a negatively charged capacitor (negative voltage state). When a positive voltage state is required, the energy stored in the capacitor (electric field energy) is temporarily transferred into an inductor (magnetic field energy) and then returned back to the capacitor, but with a positive polarity voltage. The transfer process is then halted and the energy remains stored in the capacitor, keeping the capacitor voltage in a positive state. When a negative voltage state is required again the reverse transfer process occurs, transferring all the energy back to a negatively charged capacitor.

Figure 1:
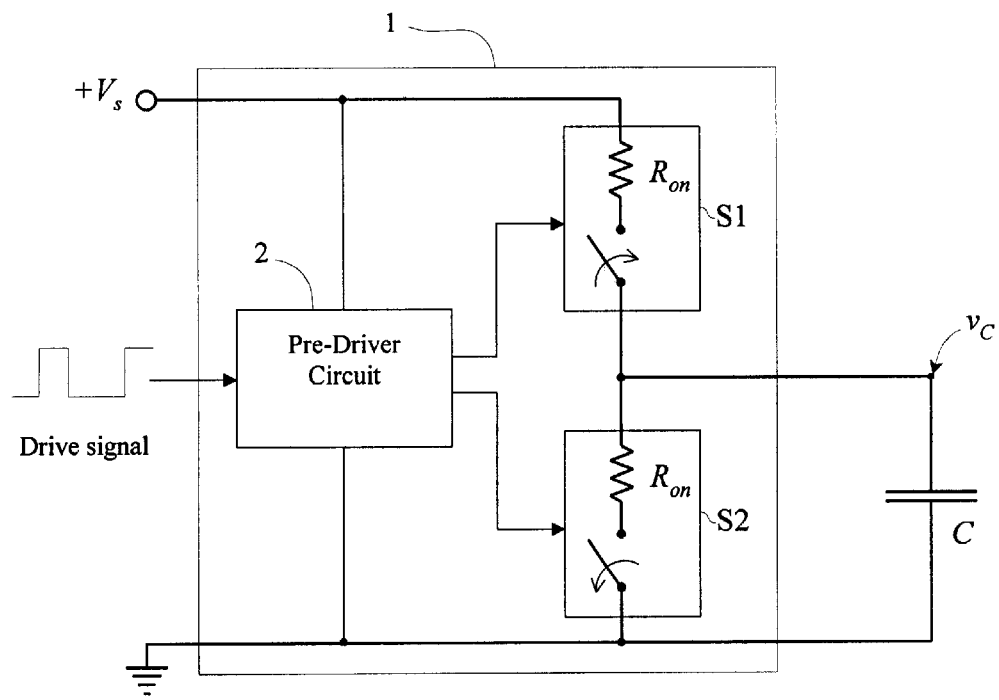
FIG. 1 illustrates the conventional manner of driving a capacitance with a square wave of variable frequency and duty cycle.
Figure 2:
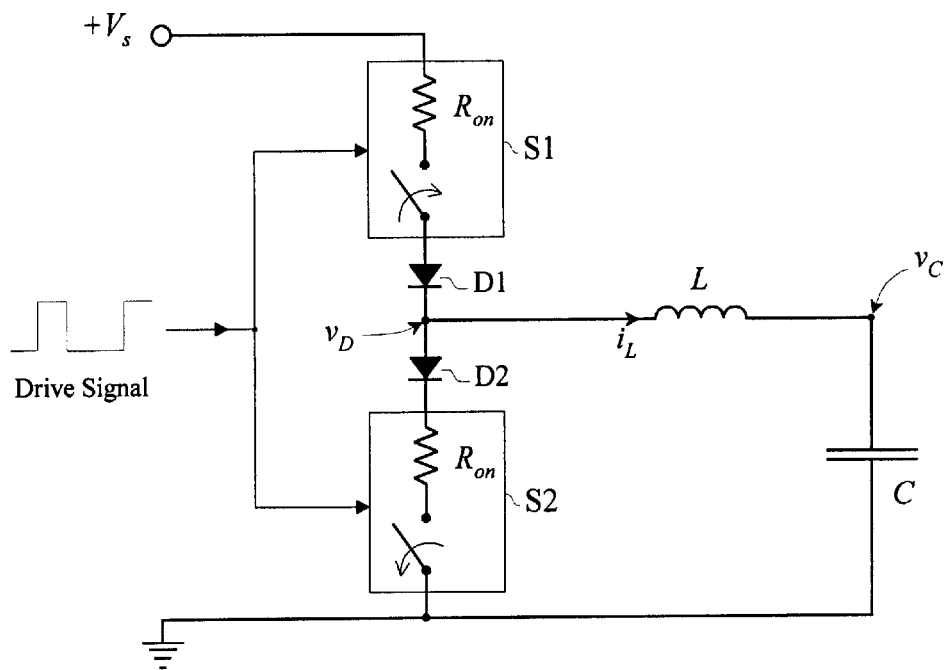
FIG. 2 is a conceptual circuit diagram illustrating a circuit in accordance with the present invention.
Figure 6:
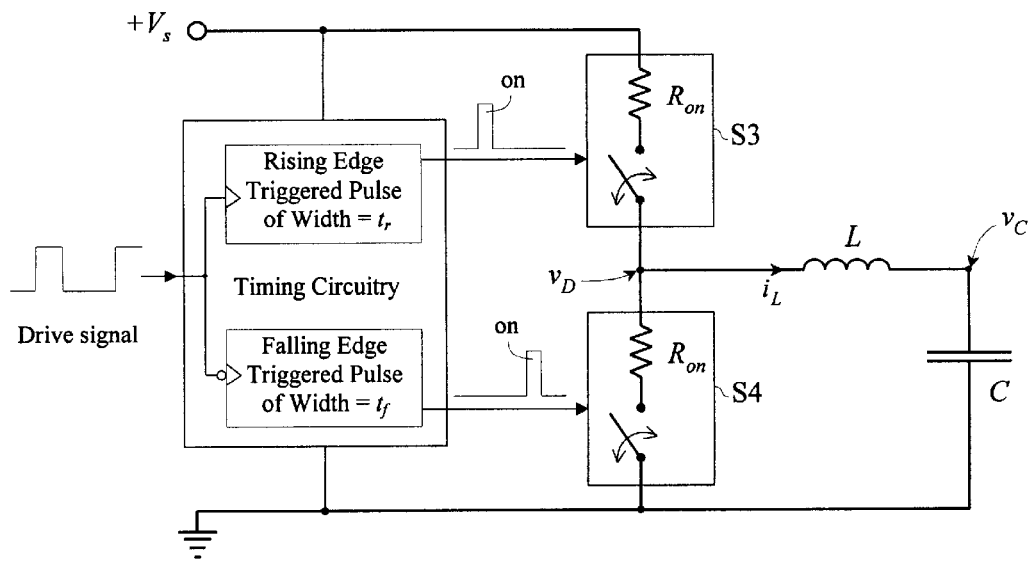
FIG. 6 is a conceptual circuit diagram illustrating a circuit in accordance with the present invention utilizing switches that can be turned both on and off, and can support both a positive or negative voltage across them.
Figure 8:
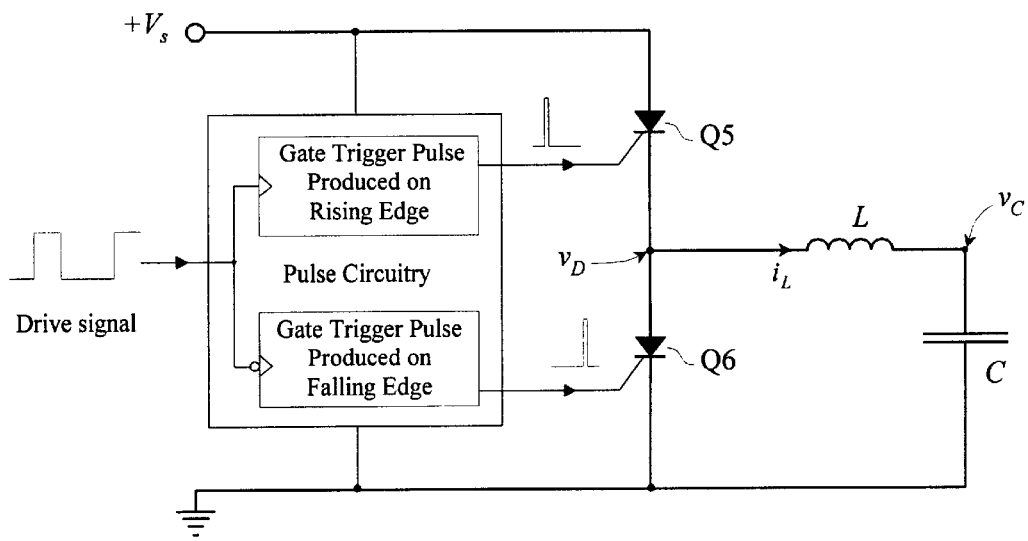
FIG. 8 shows another exemplary embodiment of the present invention utilizing SCR devices.

The transfer process is once again halted when the energy transfer has been completed. Thus the energy is therefore always stored in the capacitor but the "effective" capacitor voltage is alternated between a positive or negative voltage state. In this way a quasi-square-wave voltage can be imposed on the capacitor in a loss less manner. This process described above is basically achieved when an inductor and capacitor are resonating together, with resonance being stopped (i.e. the loop is open circuited) when the capacitor voltage is either a maximum or minimum. The resonance then only continues on command of the drive signal when the opposite voltage state is required. The process above will lose energy during each transfer when practically implemented due to switch resistances etc. A means of adding energy to system must therefore be incorporated so that the oscillations do not die out. The circuits shown in FIG. 2, FIG. 6 and FIG. 8 are all capable of operating in such a way that the process described above is achieved. The waveforms shown in FIG. 3 graphically illustrate the steady state operation of the circuit shown in FIG. 2.

The circuit of FIG. 2 consists of a voltage supply, two switches, two diodes, an inductance and the capacitive load. The switches and diodes are all connected in series across a potential difference (i.e. across the voltage supply) e.g. a positive supply rail and ground. The sequence of connection is switch—diode—diode—switch. The point between the two diodes is referred to as the midpoint. The inductance is connected between the midpoint and the capacitance, with the other end of the capacitance being connected to ground. The circuit of FIG. 6 replaces the switch/diode pairs on either side of the midpoint used in the circuit of FIG. 2 with a bilateral switch. The operation of this circuit is very similar to the first method. However, it requires timing circuitry that must be designed for a particular inductance and capacitive type load.

The operation of the circuit of FIG. 2 is as follows;

Again, assuming the process starts with the energy stored in a negatively charged capacitor (negative voltage state), switch S1 is off and S2 is on. D2 is blocking and has a voltage across it of $V_{p-}$, and S1 has a voltage across it of $V_s-(-V_{p-})=V_{p+}$. S1 is then turned on at time t=0 and S2 is turned off. This can be seen in FIG. 3 as illustrated by the drive signal. A half-sinusoidal pulse of current will then flow from the power supply through S1, D1, the inductor, L, and then into the capacitor i.e. half a cycle of a resonant oscillation will occur. The resonant oscillation is then stopped by the diode D1 after a time $t_r$ has passed. This process causes the capacitor voltage to swing in a sinusoidal manner from a negative voltage state of $V_{p-}$, to a positive voltage state of $V_{p+}$. The capacitor then stays charged (with a positive voltage) until S1 turns off and S2 turns on. When this happens, the same process as above occurs, but with the current now flowing through S2 and in the opposite direction through the inductor. Hence the capacitor is discharged and then charged again but with a negative polarity voltage. The capacitor remains in the negative state until S1 is again turned on and the whole process is repeated.

If the whole circuit is considered to be a closed energy system, then at steady state operation the energy input must equal the energy output, i.e. power input must equal power dissipated. The system gains energy when the capacitor is being charged with a positive polarity voltage i.e. when current is flowing out of the power supply through S1, D1 and the inductor and into the capacitor. This gained energy must be equal to the energy lost (i.e. power dissipated) in the internal resistances of the switches S1 and S2, and in diodes D1 and D2, when the charging or discharging currents are flowing through them. It can be seen from the equations set out below that the lower the internal resistance of the switches, the lower the power dissipation and hence the lower the required supply voltage, $V_s$. If ideal switches and diodes were to be used then the system would be loss-less and the supply voltage required would be zero.

The circuit of FIG. 2 works for a wide range of inductance and capacitance values, as the diodes automatically stop the resonance at the right instants. The switching frequency should be less than the natural resonant frequency of the LC network. Thus the circuit does not require any complex timing circuitry and only needs unidirectional switches.

Some modifications are possible to the circuit of FIG. 2 without affecting the way the circuit operates. Firstly, the sequence of each switch and diode pair on either side of the midpoint may be interchanged without any affect on its operation. Secondly, the circuit is shown connected between a positive supply rail and ground. In principle the circuit will also work connected between any potential difference such as ground and a negative supply rail, or connected across split supply rails.

Figure 3:
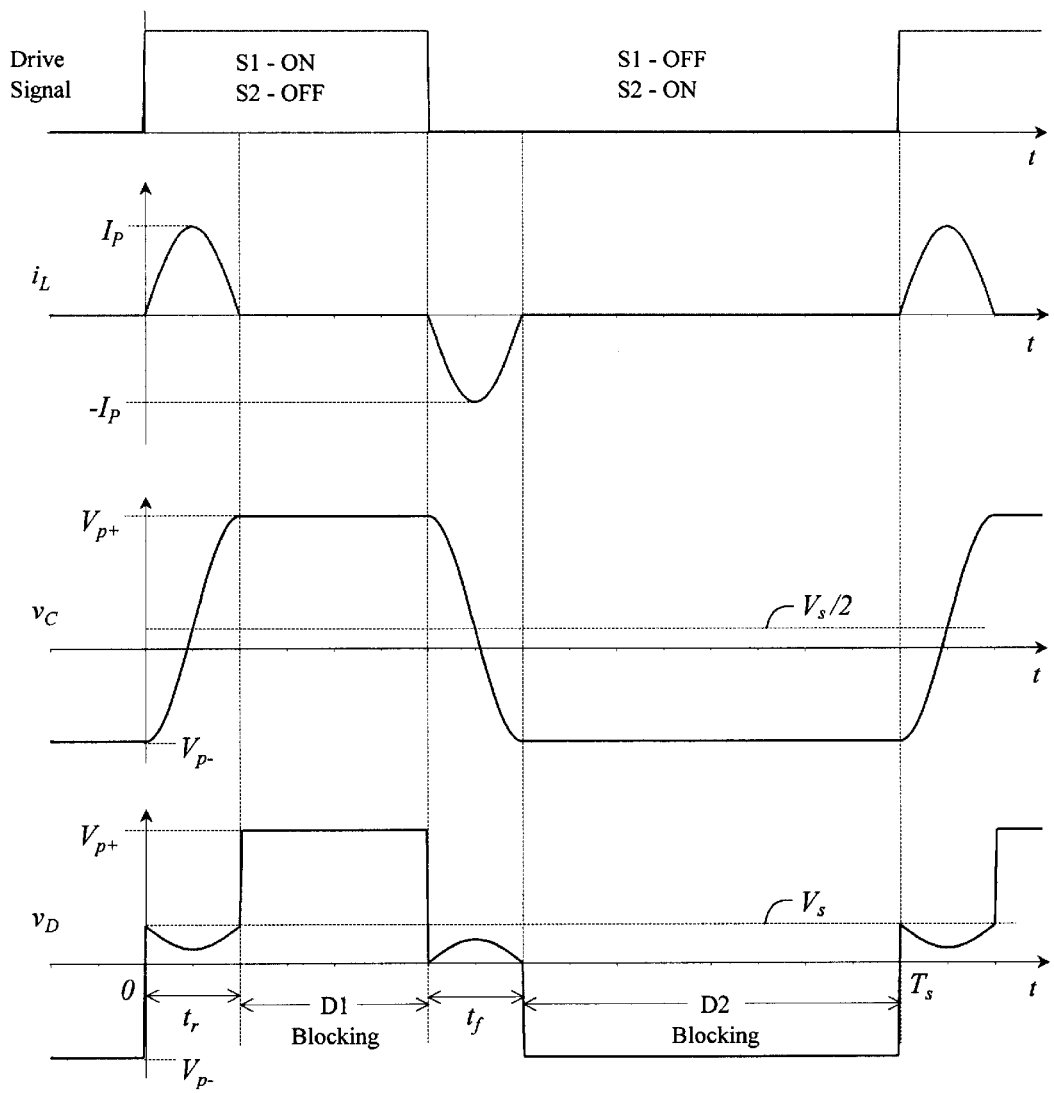
FIG. 3 illustrates the operating waveforms of the present invention.
Figure 7:
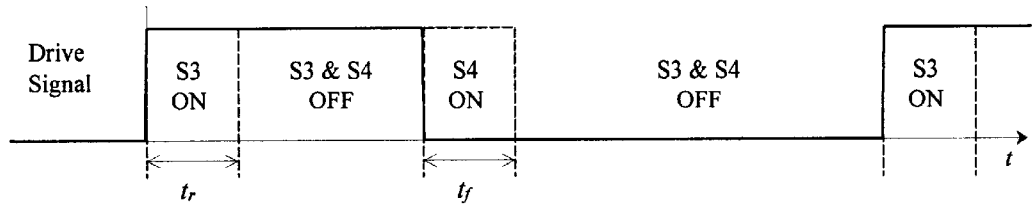
FIG. 7 illustrates the timing waveforms required to drive the switches in the circuit of FIG. 6.

The second method of implementing the present invention is to replace the switch/diode pair on either side of the midpoint by a bilateral switch (S3 and S4) as shown in FIG. 6. Switches S3 and S4 must have the capability of supporting (i.e. blocking) both a positive and a negative voltage across them and must also be capable of being turned both on and off. However they only need to be capable of conducting a current in one direction. The operational waveforms of the circuit of FIG. 6 are identical to those of the circuit of FIG. 2, and are shown in FIG. 3. The actual operation of the circuit of FIG. 6 is very similar to that of the circuit of FIG. 2. However, the switches themselves need to be driven in a different manner. For each switching transition, the respective switch must now only be turned on for a time equal to the rise and fall time, $t_r=t_f=\pi\sqrt{(LC)}$, and this is illustrated in FIG. 7. In other words, the switch in use must now be turned off once a half cycle of the resonant oscillation has occurred, to prevent the resonance from continuing. Turning off the switches at this instant has the same affect as the diodes do in the circuit of FIG. 2. The circuit of FIG. 6 therefore requires timing circuitry that only turns the respective switch on at the respective rising or falling edge of the drive signal for a time equal to the rise or fall time (half a period) of a particular LC circuit. The circuit of FIG. 6 therefore requires both timing circuitry, designed for a particular LC circuit, and bilateral switches, but its principle of operation and waveforms are identical to the circuit of FIG. 2.

Design Equations

In order to design and implement the circuit of FIG. 2 or FIG. 6 for operation to desired specifications, design equations have been developed. This has been done by first performing an analysis of the circuit and then developing the design equations. For this analysis the switches S1 and S2 are assumed to be modeled by an ideal switch in series with a resistance, $R_{on}$, referred to as the on-resistance. An analysis of the circuit of FIG. 2 can be performed by first recognizing the similarity between this circuit and the classical half-bridge Class-D series resonant inverter. The similarity can be revealed by observing that if the internal resistances, $R_{on}$, of both the switches are removed and replaced by a single resistance of value $R_{on}$ in series with the inductance, L, then the operation of the circuit is identical. The similarity between the two circuits then becomes obvious except for the diodes D1 and D2. These have the effect of "freezing" the circuit between switching transitions.

Assuming that the diodes D1 and D2 are ideal, and that the "Q" of the circuit is high enough to force a sinusoidal current with negligible harmonics, then the equations of a classical Class-D series resonant inverter may then be adapted for use in the circuit of FIG. 2.

Defining the Q of the circuit to be $$Q = \frac{1}{R_{on}}\sqrt{\frac{L}{C}} \qquad (1)$$

The following equations will aid the designer when practically implementing the circuits of FIG. 2 and FIG. 6. However, the equations only yield reasonably accurate results for circuits of a high enough Q. For practical purposes a Q of two or more is sufficient to give useful design guidelines. The following equations are also only valid if the switching frequency is less than the natural resonant frequency, $f_r$, of the LC network, and if the on-time and off-time of the drive signal is longer than the rise/fall time. This may be expressed mathematically as $$f_s \leq \frac{1}{2\pi\sqrt{LC}} = f_r \qquad (2)$$

Where the rise time, $t_r$, and the fall time, $t_f$, are given by $$t_r = t_f = \pi\sqrt{LC} \qquad (3)$$

The Peak current through each switch is $$I_p = \frac{2V_s}{\pi R_{on}} \qquad (4)$$

The peak positive voltage across the capacitor is $$V_{p+} = \frac{2V_s}{\pi R_{on}}\sqrt{\frac{L}{C}} + \frac{V_s}{2} \qquad (5)$$

The peak negative voltage across the capacitor is $$V_{p-} = -\frac{2V_s}{\pi R_{on}}\sqrt{\frac{L}{C}} + \frac{V_s}{2} \qquad (6)$$

The total power dissipated by both switches will be $$P_D = \frac{4f_s\sqrt{LC}}{\pi R_{on}}(V_s)^2 \qquad (7)$$

Each switch will dissipate half this amount of power (in its internal resistance, $R_{on}$).

For more accurate equations when using low supply voltages, account must be taken of the voltage drop across the diodes D1 and D2. Assuming the diodes have a forward voltage drop of $V_{Fon}$, but are otherwise ideal, this effect can be taken into account by modifying the equations above. This can be done by replacing $V_s$ in appropriate places in equations (4) to (7) by $V_{eff}$, where $V_{eff}$ is given by $$V_{eff} = V_s - 2V_{Fon} \qquad (8)$$

Equations (5) to (8) must then be modified to give the following. The peak current through each switch as $$I_p = \frac{2V_{eff}}{\pi R_{on}} \qquad (9)$$

The peak positive voltage across the capacitor as $$V_{p+} = \frac{2V_{eff}}{\pi R_{on}}\sqrt{\frac{L}{C}} + \frac{V_s}{2} \qquad (10)$$

The peak negative voltage across the capacitor as $$V_{p-} = -\frac{2V_{eff}}{\pi R_{on}}\sqrt{\frac{L}{C}} + \frac{V_s}{2} \qquad (11)$$

The power dissipated in the on-resistances of both switches will be $$P_{D,Ron} = \frac{4f_s\sqrt{LC}}{\pi R_{on}}(V_{eff})^2 \qquad (12)$$

Additionally, power will now also be dissipated in the diodes due to their forward voltage. The total power dissipated in both diodes is given by $$P_{D,diodes} = \frac{8f_s\sqrt{LC}}{\pi R_{on}}V_{eff}V_{Fon} \qquad (13)$$

The total power dissipated in both the on-resistances of the switches and the diodes is then given by $$P_{D,Total} = \frac{4f_s\sqrt{LC}}{\pi R_{on}}V_{eff}V_s \qquad (14)$$

A simpler and more accurate practical method of calculating the power consumption can be done as follows—given the peak to peak voltage swing across the load capacitor is $V_{pp}$, then the power consumed by the driver circuit is $$P_D = C V_{pp} V_s f_s \qquad (15)$$

In the case of a non-linear capacitance the power consumption can be calculated using the total charge required to charge the capacitor from its peak negative voltage to its peak positive voltage, termed $Q_{pp}$, giving $$P_D = Q_{pp} V_s f_s \qquad (16)$$

The validity of the above equations has been confirmed by numerical simulation and experimentally by the inventor. Equations (1) to (7) can be used for the circuits of FIG. 2, FIG. 6 and the circuit of FIG. 8. The operational waveforms of FIG. 3 are only an accurate representation of the operation of the present invention if the circuit has a high enough Q. However, circuits of lower Q still preserve the basic operating characteristics and still benefit from the advantages of the invention disclosed herein.

Design Considerations

In order to obtain a desired voltage swing across a given capacitance the follow factors must be taken into consideration: The amplitude of the voltage swing across the capacitor is directly proportional to the supply voltage; Lowering $R_{on}$ will increase the voltage swing across the capacitor;

Increasing the inductance will increase the rise and fall times and increase the voltage swing across the capacitor; Increasing the capacitance will also increase the rise and fall times but will decrease the voltage swing; The switches and diodes used must have a maximum voltage rating of $V_{p+}$, and a peak current rating of $I_p$.

Figure 4:
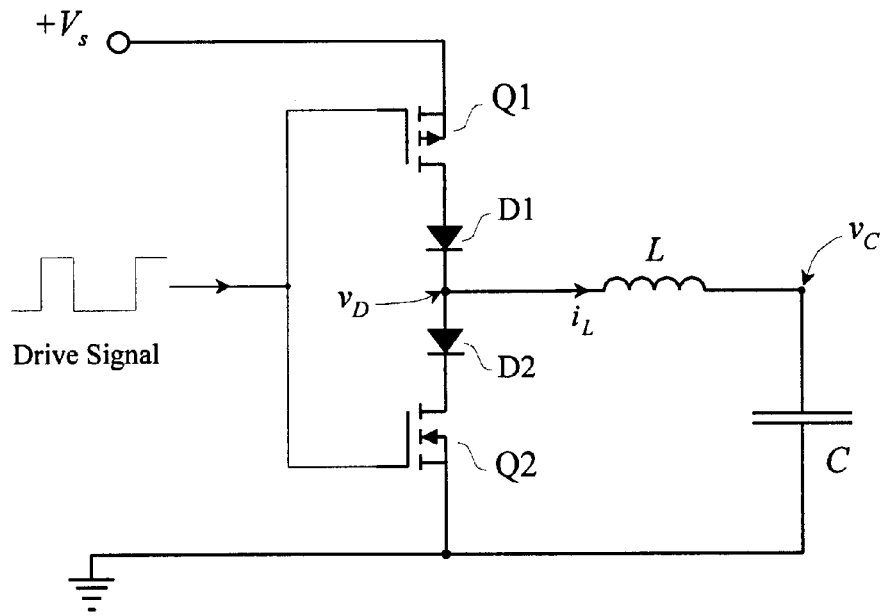
FIG. 4 is a simple exemplary embodiment of the present invention using MOSFETs as the semiconductor switches.
Figure 5:
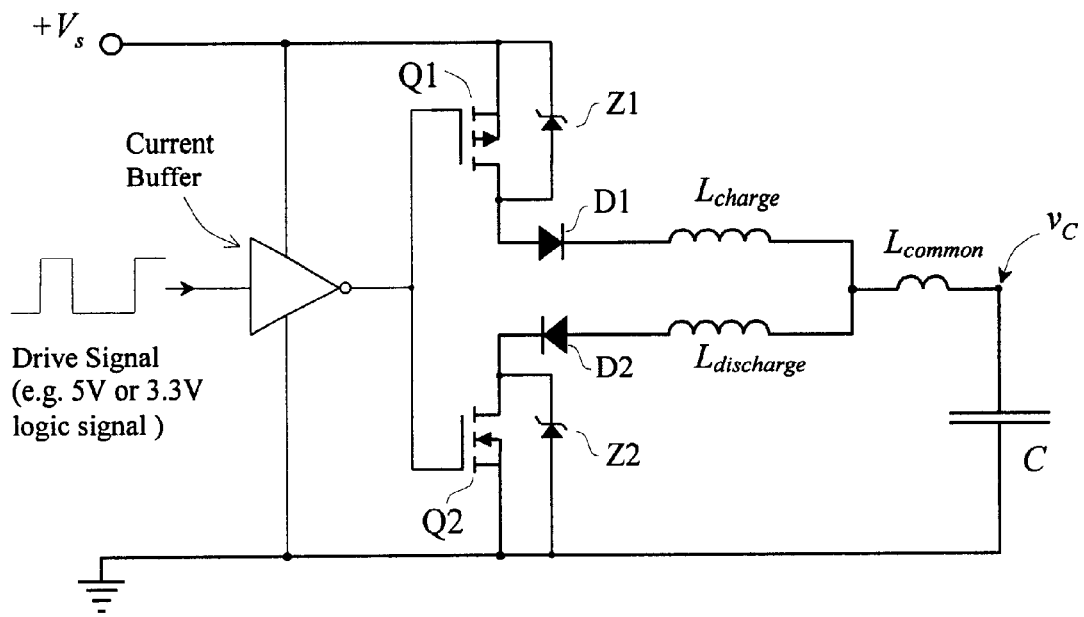
FIG. 5 is a similar embodiment to that shown in FIG. 4, this embodiment reducing the cross-conduction losses that arise due to the non-zero switching times of practical switching devices.

FIG. 4 shows a simple exemplary practical embodiment of the circuit shown in FIG. 2. The circuit employs a p-channel MOSFET and an n-channel MOSFET as the switching devices. However, the input capacitance of both MOSFETs shown in FIG. 4 may itself present a large capacitive type load. This input capacitance could be driven by a simple current buffer as shown in FIG. 5. Alternatively, it could in fact be driven by the same circuit as shown in FIG. 4, but using devices of smaller current ratings and smaller input capacitances. Thus a series of circuits shown in FIG. 4 could be linked in a chain to drive devices with bigger and bigger input capacitances. The circuit of FIG. 4 however, suffers from cross-conduction losses that arise due to the fact that practical switching devices have non-zero switching times.

FIG. 5 shows a similar practical embodiment to that shown in FIG. 4 but with a method of reducing the cross-conduction losses. This loss can be reduced to some extent by making two separate paths to charge and discharge the capacitor, with part or all of the inductance put into each separate path, as shown in FIG. 5. The total inductance, L, of the charging path for the circuit shown in FIG. 5 will then be given by $L=L_{charge}+L_{common}$. If different rise and fall times are required then different inductance values may be introduced into the charging and discharging paths. However, different inductances gives rise to a more complex mode of operation and the equations given above will no longer hold, but the circuit still operates in the manner described above.

When using the circuit of FIG. 5 in a practical application such as a MOSFET gate driver, then it is also desirable to limit the voltage swing across the (gate) capacitance being driven between two levels. This could be done by adding two back-to-back zener diodes across the capacitance. However, this has disadvantages in that it may be practically difficult, time consuming and cumbersome to add the zener diodes across the MOSFET gate capacitance for example. The zeners will also be required to alternately block and then conduct for each on and off cycle, which means there will be reverse recovery losses that detract energy from the resonant capacitance system, lowering the efficiency. FIG. 5 shows a configuration of adding the zener diodes whereby they never have a forward voltage across them and hence the reverse recovery losses are eliminated. In this configuration the zener diodes will limit the voltage swing across the capacitance being driven, they will also limit the voltage across the switching devices and they can be integrated into one "chip" together with the other semiconductor devices that are needed to construct the circuit of FIG. 5.

The present invention may also be implemented using controlled rectifiers as the switching devices. FIG. 8 is a practical embodiment of the present invention using SCRs, shown as Q5 and Q6. Controlled rectifier devices only need a trigger pulse to turn them on, and will then continue to conduct until the current through them reverses direction. Therefore the drive signal to the SCR devices must be modified accordingly in order to achieve the operation described by the present invention. This embodiment therefore requires pulse circuitry to provide the correct drive to the SCR devices. This pulse circuitry provides a gate trigger pulse to turn the SCR device, Q5, on at one edge of the drive signal. The capacitive load is then be charged through Q5 and it then automatically turns off when the current has completed a half sinusoid and attempts to reverse direction, stopping the resonance at the correct moment. The pulse circuitry must then provide a gate trigger pulse to turn the other SCR device, Q6, on at the other edge of the drive signal. The gate trigger pulse length should be less than the shortest rise or fall times required. The circuit functions in a similar manner to that of FIG. 2 with the resonance being automatically stopped at the right instants. Thus this circuit requires pulse circuitry but does not require timing circuitry and works for a wide range of inductance and capacitance values. Its principle of operation and waveforms are identical to the circuit of FIG. 2. The circuit of FIG. 8 is usable in applications requiring very high voltage swings across the capacitor being driven.

All the circuits described above refer to a capacitive load that must swing between a negatively and positively charged state. It should be noted however that if a particular application requires the voltage to swing between two particular voltages, then the circuits could be modified by one skilled in the art to achieve this. For example, a voltage swing between ground and a positive value could be achieved by inserting a decoupling capacitor in series with the inductor and a diode across the capacitor being driven (diode's anode connected to ground). However the apparent "effective" capacitor voltage that appears directly at the capacitor end of the inductor always follows the path described above i.e. swing positive and negative. Hence in this specification the terms "positively charged capacitive load" and "negatively charged capacitive load" simply means the former capacitor voltage is higher than the latter and does not necessarily imply that one is above zero potential and the other below. In all the circuits discussed above the drive signal high or low level must be longer than half the period of the LC circuit i.e. $\pi\sqrt{(LC)}$. The circuits described above also cannot keep the capacitor charged at $V_{p+}$ or $V_{p-}$ indefinitely, and the capacitor voltage eventually decays due to leakage currents.

The present invention is of use in many applications that require a capacitive load to be driven with a quasi-square-wave. Apart from low power losses, another advantage of the present invention is that it enables a lower supply voltage to be used but still has the capability of providing higher voltage drive levels. Applications of the invention include power MOSFET gate drivers and capacitance line drivers.

It will be understood that the circuit of the present invention can be provided in the form of an integrated circuit (referred to generally as a "chip"). It will also be understood that the inductance and capacitive load do not necessarily have to be incorporated into the chip as the chip itself could be designed to drive an external capacitive load that is an integral part of another circuit, device or apparatus. The leakage inductance of the connecting wires between the chip and capacitive load could provide part or all of the needed inductance. The voltage supply or power to the chip can be provided by an external source.

What is claimed is:

1. A circuit for driving a capacitive load so that a quasi-square-wave voltage is imposed on it, said circuit comprising:

voltage supply means for providing a first and a lower potential;

an inductance, said capacitive load being connected between a first end of said inductance and said lower potential of said voltage supply;

a first switch means and a first diode means connected in series between said first potential of said voltage supply and a second end of said inductance, said first diode means having its polarity orientated so that it allows current flow from said first potential of said voltage supply to said second end of said inductance;

a second switch means and a second diode means connected in series between said second end of said inductance and said lower potential of said voltage supply, said second diode means having its polarity orientated so that it allows current flow from said second end of said inductance to said lower potential of said voltage supply;

means for applying a square wave drive signal to said first and second switch means, said first switch means being closed on a first level of said drive signal and open on a second level of said drive signal and said second switch means being open on said first level of said drive signal and closed on said second level of said drive signal;

a first zener diode means in parallel with said first switch means and poled to allow said first switch means to block voltage as normal; and a second zener diode means in parallel with said second switch means and poled to allow said second switch means to block voltage as normal.

2. A circuit as claimed in claim 1, wherein part or all of said inductance is introduced in series with said first switch means and said first diode means to form a separate charging inductance, and part or all of said inductance is introduced in series with said second switch means and said second diode means to form a separate discharging inductance.

3. A circuit for driving a capacitive load so that a quasi-square-wave voltage is imposed on it, said circuit comprising:

voltage supply means for providing a first and a lower potential;

an inductance, said capacitive load being connected between a first end of said inductance and said lower potential of said voltage supply;

a first switch means and a first diode means connected in series between said first potential of said voltage supply and a second end of said inductance, said first diode means having its polarity orientated so that it allows current flow from said first potential of said voltage supply to said second end of said inductance;

a second switch means and a second diode means connected in series between said second end of said inductance and said lower potential of said voltage supply, said second diode means having its polarity orientated so that it allows current flow from said second end of said inductance to said lower potential of said voltage supply;

means for applying a square wave drive signal to said first and second switch means, said first switch means being closed on a first level of said drive signal and open on a second level of said drive signal and said second switch means being open on said first level of said drive signal and closed on said second level of said drive signal, all or part of said inductance being in series with said first switch means and said first diode means to form a separate charging inductance, and all or part of said inductance being in series with said second switch means and said second diode means to form a separate discharging inductance;

a first zener diode means in parallel with said first switch means and poled to allow said first switch means to block voltage; and a second zener diode means in parallel with said second switch means and poled to allow said second switch means to block voltage.

4. A circuit for driving a capacitive load so that a quasi-square-wave voltage is imposed on it, the circuit comprising:

voltage supply means for providing a potential difference;

an inductance, said capacitive load being connected between a first end of said inductance and the lower potential of said voltage supply;

a first bilateral switch means connected between the higher potential of said voltage supply and the second end of said inductance;

a second bilateral switch means connected between the second end of said inductance and the lower potential of said voltage supply;

a first and second timing circuitry means to which a square wave drive signal is applied;

means for applying the signal from said first timing circuitry means to said first bilateral switch means and means for applying the signal from said second timing circuitry means to said second bilateral switch means;

said first timing circuitry means closing said first bilateral switch means on one edge of said drive signal and opening it after a time equal to $\pi\sqrt{(LC)}$ and said second timing circuitry means closing said second bilateral switch means on the other edge of said drive signal and opening it after a time equal to $\pi\sqrt{(LC)}$, where L is said inductance and C is said capacitive load.

5. A method of driving a capacitive load so that a quasi-square-wave is imposed on it, comprising the steps of:

a) Connecting a capacitive load, whilst it is negatively charged, to the higher potential of a voltage supply through a first bilateral switch means and an inductance connected in series, the connection being made by closing said first bilateral switch means, said first bilateral switch means being closed by a signal from a first timing circuitry means that is triggered by one edge of a square wave drive signal, to cause said capacitive load to be positively charged;

b) Preventing said positively charged capacitive load from discharging by disconnecting it from said voltage supply by opening said first bilateral switch means, said first bi-lateral switch means being opened by the signal from said first timing circuitry after a time equal to $\pi\sqrt{(LC)}$, where L is said inductance and C is said capacitive load;

c) Connecting the said positively charged capacitive load to the lower potential of said voltage supply through a second bilateral switch means and said inductance connected in series, the connection being made by closing said second bilateral switch means, said second bilateral switch means being closed by signal from a second timing circuitry means that is triggered by the other edge of said drive signal, to cause said capacitive load to be negatively charged;

d) Preventing said negatively charged capacitive load from discharging by disconnecting it from said voltage supply by opening said second bilateral switch means, said second bilateral switch means being opened by the signal from said second timing circuitry means after a time equal to $\pi\sqrt{(LC)}$, where L is said inductance and C is said capacitive load.

6. A functional resonant gate driver for driving a gate capacitance of a power switching device in a resonant manner, said functional resonant gate driver comprising:

voltage supply means for providing a first and a lower potential;

terminal means for connection to a square wave input drive signal; and a power transistor gate, said terminal means comprising an output charge terminal and an output discharge terminal;

a first switch means and a first diode means connected in series between said first potential of said voltage supply and said output charge terminal, said first diode means having its polarity orientated so that it allows current flow from said first potential of said voltage supply to said output charge terminal;

a second switch means and a second diode means connected in series between said output discharge terminal and said lower potential of said voltage supply, said second diode means having its polarity orientated so that it allows current flow from said output discharge terminal to said lower potential of said voltage supply;

means for applying a square wave input drive signal to said first and second switch means, said first switch means being closed on a first level of said drive signal and open on a second level of said drive signal and said second switch means being open on said first level of said drive signal and closed on said second level of said drive signal;

a first zener diode means in parallel with said first switch means and poled to allow said first switch means to block voltage; and a second zener diode means in parallel with said second switch means and poled to allow said second switch means to block voltage.

* * * * *

UNITED STATES PATENT AND TRADEMARK OFFICE
CERTIFICATE OF CORRECTION

PATENT NO. : 6,853,570 B2
APPLICATION NO. : 10/037108
DATED : February 8, 2005
INVENTOR(S) : Ian Douglas De Vries It is certified that error appears in the above-identified patent and that said Letters Patent is hereby corrected as shown below:

On title page, insert -- (30) Foreign Application Priority Data   Jan. 9, 2001 (GB) …. 0100449.8 --.

Signed and Sealed this

Eighteenth Day of July, 2006

JON W. DUDAS
*Director of the United States Patent and Trademark Office*